(12) United States Patent
Nguyen

(10) Patent No.: US 6,816,025 B2
(45) Date of Patent: *Nov. 9, 2004

(54) CROSS TALK COMPENSATION CIRCUIT

(75) Inventor: Hung Thai Nguyen, Harrisburg, PA (US)

(73) Assignee: Yazaki North America, Inc., Canton, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/733,956

(22) Filed: Dec. 10, 2003

(65) Prior Publication Data

US 2004/0119549 A1 Jun. 24, 2004

Related U.S. Application Data

(63) Continuation of application No. 10/020,281, filed on Dec. 14, 2001, now Pat. No. 6,744,329.

(51) Int. Cl.[7] .............................. H03H 7/00; H04B 3/28
(52) U.S. Cl. .............................. 333/1; 333/12; 439/941
(58) Field of Search .................. 333/1, 12; 439/941

(56) References Cited

U.S. PATENT DOCUMENTS

| | | | | |
|---|---|---|---|---|
| 1,861,524 A | * | 6/1932 | Coolidge .................. | 333/12 |
| 2,667,543 A | | 1/1954 | Smith et al. .............. | 179/78 |
| 3,757,028 A | | 9/1973 | Schlessel ................ | 174/33 |
| 4,157,612 A | | 6/1979 | Rainal ..................... | 29/628 |
| 4,418,239 A | | 11/1983 | Larson et al. ............ | 174/34 |
| 4,551,576 A | | 11/1985 | Rich ....................... | 174/36 |
| 4,698,025 A | | 10/1987 | Silbernagel et al. ...... | 439/79 |
| 4,831,497 A | | 5/1989 | Webster et al. .......... | 361/406 |
| 4,878,847 A | | 11/1989 | Rutledge ................. | 439/74 |
| 5,186,647 A | | 2/1993 | Denkmann et al. ...... | 439/395 |
| 5,295,869 A | | 3/1994 | Siemon et al. ........... | 439/620 |
| 5,299,956 A | | 4/1994 | Brownell et al. ......... | 439/638 |
| 5,310,363 A | | 5/1994 | Brownell et al. ......... | 439/676 |
| 5,319,342 A | | 6/1994 | Kuroki .................... | 336/170 |
| 5,322,972 A | | 6/1994 | Fitch et al. ............... | 174/88 |
| 5,326,284 A | | 7/1994 | Bohbot et al. ........... | 439/676 |
| 5,341,419 A | | 8/1994 | Ferry ...................... | 379/417 |
| 5,362,257 A | | 11/1994 | Neal et al. ............... | 439/676 |
| 5,414,393 A | | 5/1995 | Rose et al. .............. | 333/1 |
| 5,430,247 A | | 7/1995 | Bockelman .............. | 174/33 |
| 5,432,484 A | | 7/1995 | Klas et al. ............... | 333/1 |
| 5,488,201 A | | 1/1996 | Liu ......................... | 174/262 |
| 5,618,185 A | | 4/1997 | Aekins .................... | 439/76.1 |
| 5,663,870 A | | 9/1997 | Kerndlmaier ............ | 361/763 |
| 5,700,167 A | | 12/1997 | Pharney et al. .......... | 439/676 |
| 5,931,703 A | | 8/1999 | Aekins .................... | 439/676 |

(List continued on next page.)

FOREIGN PATENT DOCUMENTS

| | | | | |
|---|---|---|---|---|
| DE | 0421174 A2 | 9/1990 | ......... | H01R/13/703 |
| DE | 0525703 B1 | 7/1992 | ......... | H01R/13/719 |
| GB | 2233157 | 6/1989 | ........... | H05K/1/02 |
| JP | 2-91987 | 9/1988 | ........... | H05K/1/11 |
| JP | 2-268484 | 11/1990 | ........... | H05K/1/02 |

OTHER PUBLICATIONS

The Sieman Company Catalog 2000, p. 52.

*Primary Examiner*—Robert Pascal
*Assistant Examiner*—Kimberly Glenn
(74) *Attorney, Agent, or Firm*—Barley Snyder

(57) ABSTRACT

A low cross talk compensation circuit comprising a first signal pair having a first conductor and a second conductor parallel to the first conductor, and a second signal pair having a third conductor and a fourth conductor parallel to the third conductor, wherein each conductor is attached to a corresponding input signal. A first compensation line attached to the first input signal and a second compensation line attached to the third input signal are intertwined forming a first compensation line assembly with capacitive and inductive coupling parallel to and flanked by the second and third conductors. A third compensation line attached to the fourth input signal and a fourth compensation line attached to the second input signal are intertwined forming a second compensation line assembly with capacitive and inductive coupling parallel to and adjacent to the second conductor.

8 Claims, 2 Drawing Sheets

U.S. PATENT DOCUMENTS

| | | | |
|---|---|---|---|
| 5,997,358 A | * 12/1999 | Adriaenssens et al. | 439/676 |
| 6,023,200 A | 2/2000 | Rhee | 333/1 |
| 6,057,743 A | 5/2000 | Aekins | 333/1 |
| 6,165,018 A | 12/2000 | Arnett et al. | 439/620 |
| 6,168,474 B1 | 1/2001 | German et al. | 439/676 |
| 6,190,211 B1 | 2/2001 | Chu | 439/676 |
| 6,231,397 B1 | 5/2001 | de la Borbolla et al. | 439/676 |
| 6,356,162 B1 | 3/2002 | DeFlandre et al. | 333/4 |
| 6,379,157 B1 | 4/2002 | Curry et al. | 439/676 |
| 6,464,529 B1 | 10/2002 | Jensen et al. | 439/405 |
| 6,520,808 B2 | 2/2003 | Forbes et al. | 439/676 |

* cited by examiner

CROSS TALK COMPENSATION CIRCUIT

RELATED APPLICATION DATA

This is a continuation application of U.S. Ser. No. 10/020,281, filed Dec. 14, 2001 now U.S. Pat. No. 6,744,329.

FIELD OF THE INVENTION

The present invention relates to a transmission medium, and more particularly, to a low cross talk electrical signal transmission medium.

BACKGROUND OF THE INVENTION

The United States Federal Communications Commission (FCC) has adopted standards for electrical connectors used in the telecommunications industry to ensure intermateability. The most commonly utilized electrical connector is a modular plug and jack. The plug is typically terminated to a cable having a plurality of parallel conductors that are paired to form a signal loop, and the jack is commonly mounted to a panel or a printed circuit board connected to a communications network. As the modular plugs are utilized more frequently in high frequency data and communication applications, interference or cross talk that arises in adjacent and parallel contacts of the jack, and to a lesser degree in the plug, has become a problem in the industry. When an electrical signal of a given frequency is applied to a pair of conductors, an unequal portion of signal energy is transmitted to the individual conductors of an adjacent pair by each conductor of the signal pair. This transmission is primarily due to capacitive and inductive couplings between adjacent conductors being substantially higher than couplings of the other conductor of the signal pair, resulting in cross talk. Cross talk is further increased when both conductors of the signal pair are placed adjacent to and outside of opposing conductors of the other signal pair. The magnitude of the cross talk is effected by such factors as the positioning of the conductors, the distance between adjacent conductors and the dielectric material between the conductors.

It has been found that cross talk coupling induced by the plug and jack interface can be reduced by shifting the placement of the conductors after they exit the jack so as to induce signals of opposite phase to those which were induced inside the plug and jack. To decrease cross talk, the conductors that form both pairs should be routed in a pattern that is opposite in polarity to the pattern that produces cross talk in the jack and plug. One such routing method is disclosed in U.S. Pat. No. 5,299,956 and U.S. Pat. No. 5,310,363 issued to Brownell et al. Brownell et al. teaches a low cross talk transmission assembly comprising an electrical connector having a first and second conductor forming a first signal pair and a third and fourth conductor forming a second signal pair. The first and second conductors are positioned adjacent and parallel to each other. The third conductor is positioned adjacent and parallel to the first conductor, and the fourth conductor is positioned adjacent and parallel to the second conductor. Because this arrangement induces cross talk from one signal pair to another signal pair when signals are applied to either one of the pairs, the third conductor is routed adjacent to and parallel to the second conductor and away from the first conductor, and the fourth conductor is routed adjacent and parallel to the first conductor and away from the second conductor. This new path configuration reduces a substantial amount of cross talk induced in the first configuration.

An alternative solution to the cross talk problem is disclosed in U.S. Pat. No. 5,488,201 issued to Liu. In Liu a first end of a first conductor and a first end of a third conductor are folded into bends that are mutually inserted into each other and alternately arranged. Also, a first end of a second conductor and a first end of a fourth conductor are folded into bends that are mutually inserted into each other and alternately arranged. The alternating arrangement of the first and third conductors and the second and fourth conductors reduces the amount of cross talk between the conductors by forming a mutually corresponding capacitive arrangement for restoring electrical balance of the conductive pairs. This design, however, is intricate and requires complex configurations of the conductors to decrease the amount of cross talk. Further, the configurations are predisposed and therefore can not be manipulated to change impedance without manufacturing additional products having additional configurations.

It is therefore desirable to develop a less intricate design that may be easily manipulated to change impedance for partial cancellation of cross talk induced into a signal carrying cable pair by modular jacks and plugs, or other input/output signal connectors, while maintaining proper longitudinal balance and characteristics within the connector system.

SUMMARY OF THE INVENTION

This invention relates to a low cross talk electrical signal transmission assembly comprising a signal transmission medium having a first signal pair and a second signal pair. The first signal pair having a first conductor and a second conductor. The second signal pair having a third conductor and a fourth conductor. Each conductor is attached to a corresponding input signal. A first compensation line is attached to the first input signal, and a second compensation line is attached to the third input signal. The first compensation line and the second compensation line are intertwined to create a first compensation line assembly having capacitive and inductive coupling. A third compensation line is attached to the fourth input signal, and a fourth compensation line is attached to the second input signal. The fourth compensation line and the third compensation line are intertwined to create a second compensation line assembly with capacitive and inductive coupling.

BRIEF DESCRIPTION OF THE DRAWINGS

The invention will now be described by way of example with reference to the accompanying figures in which.

DETAILED DESCRIPTION OF THE PREFERRED EMBODIMENTS

Figure 1:
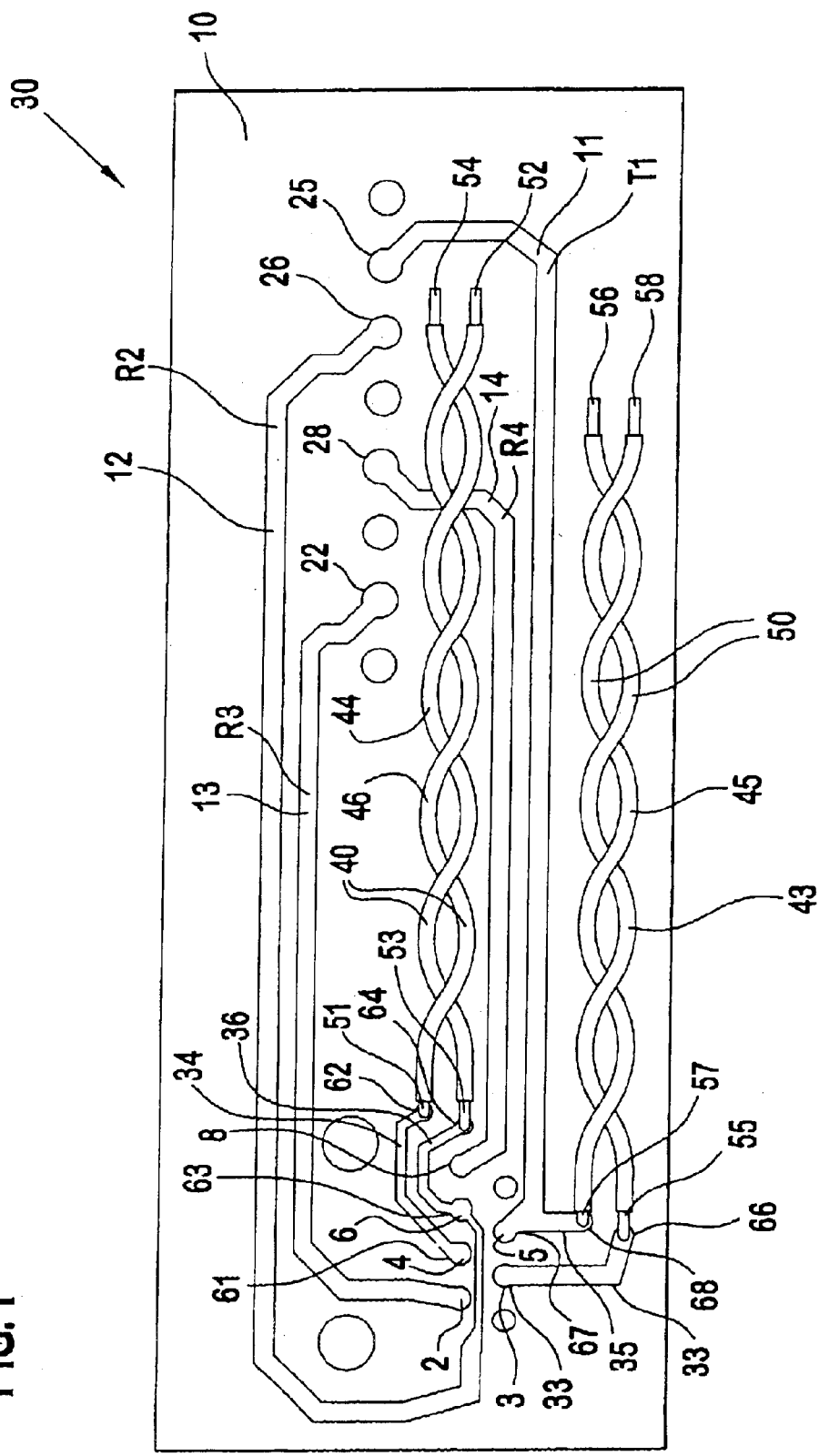
FIG. 1 is a top view of a first side of a circuit board showing an embodiment of the low cross talk compensation circuit of the present invention.
Figure 2:
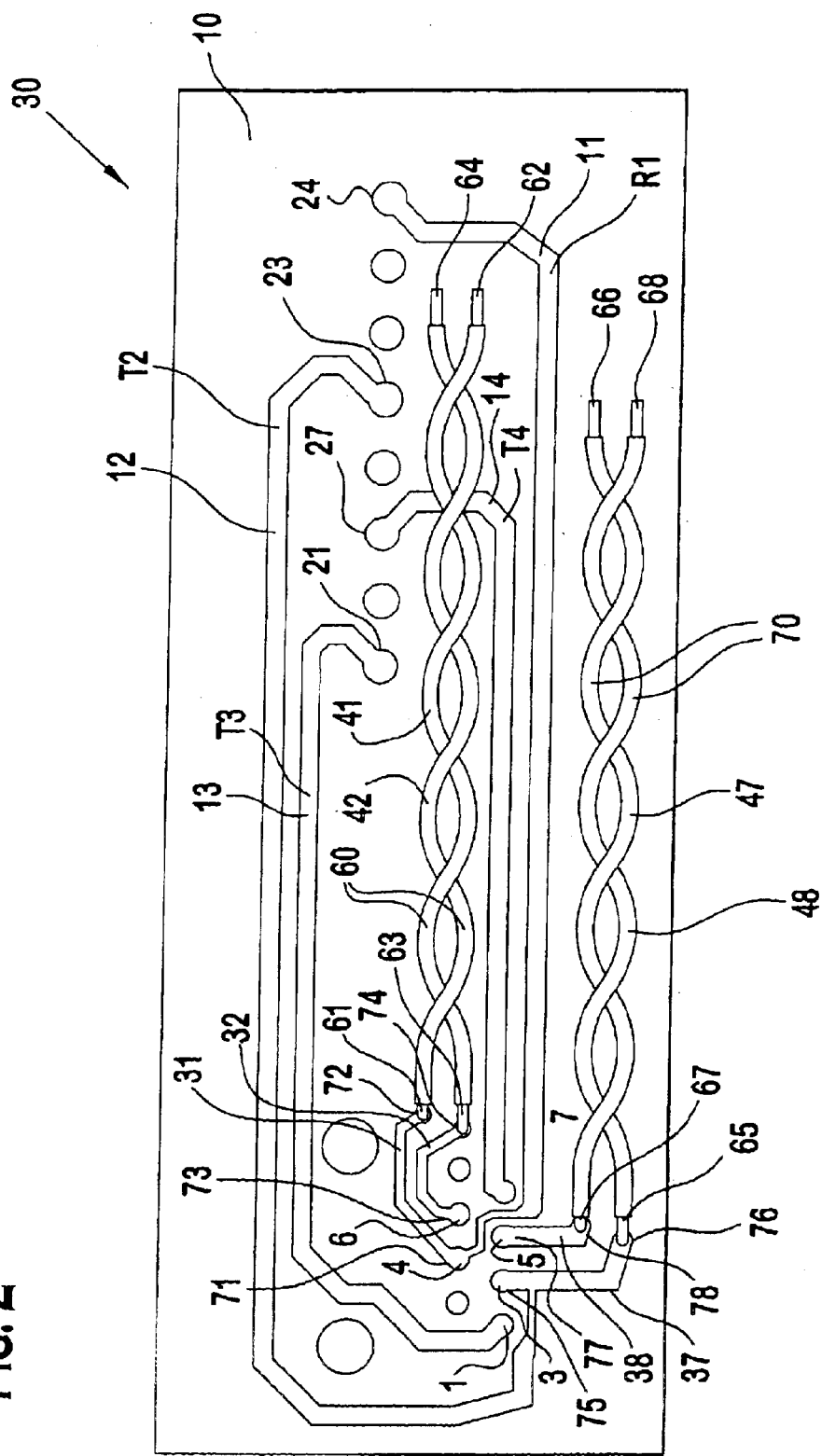
FIG. 2 is a top view of a second side of the circuit board showing the low cross talk compensation circuit of the present invention.

FIGS. 1 and 2 show a first side 20 and a second side 30 of a printed circuit board 10, respectively. The printed circuit board 10 contains a plurality of signal input contacts 1, 2, 3, 4, 5, 6, 7, 8 and a plurality of signal output contacts 21, 22, 23, 24, 25, 26, 27, 28. The signal input contacts 1, 2, 3, 4, 5, 6, 7, 8 are electrically connected to the signal output contacts 21, 22, 23, 24, 25, 26, 27, 28 by four signal pairs 11, 12, 13, 14. Each signal pair 11, 12, 13, 14 has a tip (T) conductor and a ring (R) conductor. A first signal pair 11 comprises a ring conductor R1 and a tip conductor T1. A second signal pair 12 comprises a ring conductor R2 and a tip conductor T2. A third signal pair 13 comprises a ring conductor R3 and a tip conductor T3, and a fourth signal pair 14 comprises a ring conductor R4 and a tip conductor T4. The conductors T1, R1, T2, R2, T3, R3, T4, and R4 are represented by circuit trace lines on the printed circuit board 10.

The electrical connection of the printed circuit board 10 will now be described in greater detail. As shown in FIG. 1, on the first side 20 of the printed circuit board 10, the signal input contact 2 is electrically connected to the signal output contact 22 by the conductor R3. The signal input contact 5 is electrically connected to the signal output contact 25 by the conductor T1. The signal input contact 6 is electrically connected to the signal output contact 26 by the conductor R2. The signal input contact 8 is electrically connected to the signal output contact 28 by the conductor R4. The conductor R4 and the conductor R3 are routed from their corresponding signal input contacts 8, 2 to their corresponding signal output contacts 28, 22 adjacent and parallel to each other. The conductor T1 is routed from the signal input contacts 5 to the signal output contact 25 adjacent and parallel to the conductor R4. The conductor R2 is routed from the signal input contacts 6 to the signal output contact 26 adjacent and parallel to the conductor R3. The conductors T1 and R2 thereby flank the conductors R4 and R3.

As shown in FIG. 1, the signal input contact 4 and the signal input contact 6 are electrically connected to conductors 34, 36, respectively. The conductor 34 has a first end 61 connected to the signal input contact 4 and a second end 62 connected to a first part 51 of an insulated compensation line 44. The first part 51 of the insulated compensation line 44 is stripped prior to connection to the second end 62. The conductor 36 has a first end 63 connected to the signal input contact 6 and a second end 64 connected to a first part 53 of an insulated compensation line 46. The first part 53 of the insulated compensation line 46 is stripped prior to connection to the second end 64. The insulated compensation lines 44, 46 are twisted to intertwine the compensation line 44 and the compensation line 46 to form a compensation line assembly 40. The compensation line assembly 40 is positioned substantially parallel to the printed circuit board 10 and substantially parallel to and adjacent to the conductor R4 and the conductor R3. Second parts 52, 54 of the compensation lines 44, 46, respectively, remain unattached to the printed circuit board 10. The second parts 52, 54 may alternatively be tacked or otherwise attached to the circuit board 10 for example by soldering them to a non-electrical pad or via on the circuit board 10. It should be appreciated by those skilled in the art that the first parts 51, 53 of the compensation lines 44, 46 may be attached directly to the signal input contacts 4, 6, to obtain a substantially similar result. It should also be understood that the length of the compensation line assembly 40 may be varied to achieve various levels of crosstalk compensation.

The signal input contact 3 and the signal input contact 5 are electrically connected to conductors 33, 35, respectively. The conductor 33 has a first end 65 connected to the signal input contact 3 and a second end 66 connected to a first part 55 of an insulated compensation line 43. The first part 55 of the insulated compensation line 43 is stripped prior to connection to the second end 66. The conductor 35 has a first end 67 connected to the signal input contact 5 and a second end 68 connected to a first part 57 of an insulated compensation line 45. The first part 57 of the insulated compensation line 45 is stripped prior to connection to the second end 68. The insulated compensation lines 43, 43 are twisted to intertwine the compensation line 43 and the compensation line 45 to form a compensation line assembly 50. The compensation line assembly 50 is positioned substantially parallel to the printed circuit board 10 and substantially parallel to and adjacent to the conductor T1. Second parts 56, 58 of the compensation lines 43, 45, respectively, remain unattached to the printed circuit board 10. The second parts 52, 54 may alternatively be tacked or otherwise attached to the circuit board 10 for example by soldering them to a non-electrical pad or via on the circuit board 10. It should be understood by those skilled in the art that the first parts 55, 57 of the compensation lines 43, 45 may be attached directly to the signal input contacts 3, 5, to obtain a substantially similar result. It should also be understood that the length of the compensation line assemble 40 may be varied to achieve various levels of crosstalk compensation.

As shown in FIG. 2, on the second side 30 of the printed circuit board 10, the signal input contact 1 is electrically connected to the signal output contact 21 by the conductor T3. The signal input contact 3 is electrically connected to the signal output contact 23 by means of the conductor T2. The signal input contact 4 is electrically connected to the signal output contact 24 by means of the conductor R1. The signal input contact 7 is electrically connected to the signal output contact 27 by means of the conductor T4. The conductor T3 and the conductor T4 are routed from their corresponding signal input contacts 1, 7 to their corresponding signal output contacts 21, 27 adjacent and parallel to each other. The conductor T2 is routed from the signal input contacts 3 to the signal output contact 23 adjacent and parallel to the conductor T3. The conductor R1 is routed from the signal input contact 4 to the signal output contact 24 adjacent and parallel to the conductor T4. The conductors T2 and R1 thereby flank the conductors T3 and T4. The conductors T2, T3, T4 and R1, located on the second side 30 of the printed circuit board 10, are further positioned substantially parallel to the conductors R2, R4, R3 and T1, respectively, located on the first side 20 of the printed circuit board 10.

As shown in FIG. 2, the signal input contact 4 and the signal input contact 6 are electrically connected to conductors 31, 32, respectively. The conductor 31 has a first end 71 connected to the signal input contact 4 and a second end 72 connected to a first part 61 of an insulated compensation line 41. The first part 61 of the insulated compensation line 41 is stripped prior to connection to the second end 72. The conductor 32 has a first end 73 connected to the signal input contact 6 and a second end 74 connected to a first part 63 of an insulated compensation line 42. The first part 63 of the insulated compensation line 42 is stripped prior to connection to the second end 74. The insulated compensation lines 41, 42 are twisted to intertwine the compensation line 41 and the compensation line 42 to form a compensation line assembly 60. The compensation line assembly 60 is positioned substantially parallel to the printed circuit board 10 and substantially parallel to and adjacent to the conductor T3 and the conductor T4. Second parts 62, 64 of the compensation lines 41, 42, respectively, remain unattached to the printed circuit board 10. The second parts 52, 54 may alternatively be tacked or otherwise attached to the circuit board 10 for example by soldering them to a non-electrical pad or via on the circuit board 10. The compensation line assembly 60 located on the second side 30 of the printed circuit board 10 is further positioned substantially parallel to the corresponding compensation line assembly 40 located on the first side 20 of the printed circuit board 10. It should be appreciated by those skilled in the art that the first parts 61, 63 of the compensation lines 41, 42 may be attached directly to the signal input contacts 4, 6, to achieve a substantially similar result. It should also be understood that the length of the compensation line assembly 40 may be varied to achieve various levels of crosstalk compensation.

The signal input contact 3 and the signal input contact 5 are electrically connected to conductors 37, 38, respectively. The conductor 37 has a first end 75 connected to the signal input contact 3 and a second end 76 connected to a first part 65 of an insulated compensation line 47. The first part 65 of the insulated compensation line 47 is stripped prior to connection to the second end 76. The conductor 38 has a first end 77 connected to the signal input contact 5 and a second end 78 connected to a first part 67 of an insulated compensation line 48. The first part 67 of the insulated compensation line 48 is stripped prior to connection to the second end 78. The insulated compensation lines 47, 48 are twisted to intertwine the compensation line 47 and the compensation line 48 to form a compensation line assembly 70. The compensation line assembly 70 is positioned substantially parallel to the printed circuit board 10 and substantially parallel to and adjacent to the conductor R1. Second parts 66, 68 of the compensation lines 47, 48, respectively, remain unattached to the printed circuit board 10. The compensation line assembly 70 located on the second side 30 of the printed circuit board 10 is further positioned substantially parallel to the corresponding compensation line assemblies 50 located on the first side 20 of the printed circuit board 10. It should be understood by those skilled in the art that the first parts 65, 67 of the compensation lines 47, 48 may be attached directly to the signal input contacts 3, 5, to achieve a substantially similar result. It should also be understood that the length of the compensation line assembly 40 may be varied to achieve various levels of crosstalk compensation.

Advantageously, the impedance of the compensation assemblies 40, 50, 60, 70 may be varied by increasing or decreasing the number of twists in the pairs of compensation lines 44 and 46, 43 and 45, 41 and 42, 47 and 48. While the present invention has been described in connection with the illustrated embodiments, it will be appreciated and understood that modifications may be made without departing from the true spirit and scope of the invention. For example, it should be appreciated by one skilled in the art that the number and location of the signal pairs, the number and location of the conductors, as well as the number and location of the compensation assemblies, may be increased or decreased to obtain substantially similar results.

What is claimed is:

1. A low cross talk electrical signal transmission assembly having a signal transmission medium and further comprising:

a first signal pair having a first conductor and a second conductor;

a second signal pair having a third conductor and a fourth conductor;

a first input signal having the first conductor attached thereto;

a second input signal having the second conductor attached thereto;

a third input signal having the third conductor attached thereto;

a fourth input signal having the fourth conductor attached thereto;

a first compensation line attached to the first input signal; and a second compensation line attached to the third input signal and intertwined with the first compensation line to create a first compensation line assembly having capacitive and inductive coupling.

2. The low cross talk electrical signal transmission assembly of claim 1, wherein the first conductor and the third conductor are ring conductors and the second conductor and the fourth conductor are tip conductors.

3. The low cross talk electrical signal transmission assembly of claim 1, wherein the first conductor and the third conductor are tip conductors and the second conductor and the fourth conductor are ring conductors.

4. The low cross talk electrical signal transmission assembly of claim 1, wherein the signal transmission medium is a circuit board.

5. A method of reducing cross talk between two pairs of conductors extending from a first connector and across a substrate to a second connector, the method comprising:

arranging selected ones of the conductors on the substrate adjacent to each other for coupling their respective electrical signals to each other and;

connecting at least one pair of mutually insulated intertwined conductors to one end of a pair of selected ones of the conductors extending across the substrate, the mutually intertwined conductors having a connected end being in electrical contact with the selected ones of the conductors and a free end opposite the connected end, the free end being unattached to the substrate.

6. The method of claim 5 further comprising the step of arranging the selected ones of the conductors on two opposing sides of the substrate adjacent to each other for coupling their respective electrical signals to each other.

7. The method of claim 6 further comprising the step of arranging two pairs of the mutually insulated intertwined conductors opposite each other on the opposing sides of the substrate.

8. The method of claim 6 wherein the selected ones of the conductors on the two opposing sides are arranged to be parallel to each other for coupling their respective electrical signals between the two opposing sides.

* * * * *